United States Patent [19]

Mitsutsuka

[11] Patent Number: 4,697,115

[45] Date of Patent: Sep. 29, 1987

[54] SURFACE ACOUSTIC WAVE DEVICE

[75] Inventor: Syuichi Mitsutsuka, Tokyo, Japan

[73] Assignee: Clarion Co., Ltd., Tokyo, Japan

[21] Appl. No.: 785,938

[22] Filed: Oct. 9, 1985

[30] Foreign Application Priority Data

Oct. 15, 1984 [JP] Japan ................................ 59-215952

[51] Int. Cl.$^4$ ............................................ H01L 41/08
[52] U.S. Cl. .............................. 310/313 R; 310/313 D; 333/150; 333/152; 333/193; 333/195
[58] Field of Search ............. 310/313 R, 313 A, 313 B, 310/313 D; 333/150, 151, 152, 153, 193, 194, 195

[56] References Cited

U.S. PATENT DOCUMENTS

| | | | |
|---|---|---|---|
| 4,028,649 | 6/1977 | Komatsu et al. | 333/194 |
| 4,233,573 | 11/1980 | Grudkowski | 310/313 R X |
| 4,401,956 | 8/1983 | Joshi | 333/152 |
| 4,420,730 | 12/1983 | Wakatsuki et al. | 333/195 |
| 4,426,732 | 1/1984 | Mori | 333/193 X |
| 4,451,805 | 5/1984 | Ono et al. | 310/313 D X |

Primary Examiner—Mark O. Budd
Assistant Examiner—Emanuel Todd Voeltz
Attorney, Agent, or Firm—Flynn, Thiel, Boutell & Tanis

[57] ABSTRACT

A surface acoustic wave device includes a semiconductor substrate, a piezoelectric film disposed on the semiconductor substrate, at least one pair of comb-shaped electrodes constituting an input transducer, and an output transducer a plurality of surface acoustic wave filters having different bands, which include a plurality of metal electrodes, so disposed that each of them is located between the input and output comb-shaped electrodes of each of the surface acoustic wave filters, a bias voltage applying arrangement for applying bias voltages to each of the metal electrodes; and a bias voltage regulating arrangement for regulating the bias voltages.

5 Claims, 22 Drawing Figures

SURFACE ACOUSTIC WAVE DEVICE

FIELD OF THE INVENTION

This invention relates to a surface acoustic wave (hereinbelow abbreviated to SAW) device which includes a semiconductor substrate, a piezoelectric film disposed thereon and at least a pair of in/output transducers disposed at the neighborhood of the extremities of the surface thereof, and more specifically to a SAW device used as a variable band SAW filter consisting of a plurality of SAW filters having different bands, a SAW delay line, etc.

BACKGROUND OF THE INVENTION

SAW filters are widely utilized as IF filters in television receivers and filters in various kinds of communication apparatuses. But they are usually used as a fixed band filter.

FIG. 7 shows a perspective view indicating the general form of the usual SAW filter, in which the reference numeral 1 is a piezoelectric substrate; 2' indicates comb-shaped electrodes constituting an input transducer 2; and 3' indicates comb-shaped electrodes constituting an output transducer 3.

Since the band of such a filter is determined by the form and number of pairs of comb-shaped electrodes, it is a constant proper to the SAW filter and it is not possible to vary it. However, variable band filters are strongly desired for communication apparatuses, in which a frequency band varies with time, and for various sorts of multi-channel communication apparatuses.

FIG. 8(a) is a top view illustrating a representative variable band SAW filter, in which corresponding items are indicated by the same reference numerals as in FIG. 7; 4 represents a switching circuit; 5 represents the input terminal; and 6 represents the output terminal. In the SAW filter indicated in FIG. 8(a) a plurality of SAW filters are mounted on a substrate so that the bands of the filters are adjacent to each other, and one of the bands is selected by switching an external circuit 4. FIG. 8(b) shows five curves representing the relation between the frequency and output, when the contact of the switch in the switching circuit is respectively positioned at A, B, C, D and E in FIG. 8(a).

For such a prior art filter an external circuit 4 for switching is inevitable, what is problematical with respect to the manufacturing cost and space saving. In addition, it has as a drawback that the freedom for the shape of the pass band is small, because it is controlled only by switching to select a single output transducer.

Further, a SAW delay line is used for signal processing in radar devices and as a delay line in a SAW oscillator. In particular, development of a device for which the delay time can be varied is desired, because such a device can be applied to a variable frequency oscillator and to a ghost canceler for a television receiver.

FIGS. 20 and 21 illustrate representative prior art SAW devices used as variable delay lines, in which the reference numeral 1 represents a piezoelectric substrate; 2' indicates comb-shaped electrodes constituting the input transducer 2; 3A, 3B, ..., are comb-shaped electrodes constituting output transducers 3; 4 is a switching circuit; 5 is the input terminal; and 6 is the output terminal.

FIG. 20 illustrates a so-called delay line with taps, for which the area of the substrate may be small, but which has as a disadvantage that interference between different taps is produced due to reflection of a SAW at each of the taps (output comb-shaped electrodes 3A, 3B, ...). On the other hand, for the device illustrated in FIG. 21, although interferences occurring between the output comb-shaped electrodes 3A, 3B, ... is small, a disadvantage is that a large piezoelectric substrate 1 is necessary. Further, for both the devices an external circuit 4 for switching is necessary and thus they are problematical with respect to manufacturing cost and space saving.

OBJECT OF THE INVENTION

An object of this invention is to provide a variable delay time SAW delay line requiring no external circuit and acting as an ameliorated SAW device which does not have the drawbacks of the prior art techniques described above.

Another object of this invention is to provide a variable band SAW filter requiring no switching circuit such as that indicated in FIG. 8 and having a large freedom.

SUMMARY OF THE INVENTION

In order to achieve this object of this invention, a SAW device according to this invention comprises metal electrodes between the input and output transducers on a piezoelectric film, an arrangement for applying bias voltages between each of the metal electrodes and the semiconductor substrate, and an arrangement for controlling the bias voltages.

The part where the metal electrodes are disposed has a so-called monolithic MIS (Metal/Insulator/Semiconductor) structure. The propagation loss of a SAW propagating in such a structure varies considerably, depending on the bias voltages applied between the metal electrodes and the semiconductor substrate. FIG. 9 shows an example of relations between the propagation loss and the bias voltage with a parameter of temperature. As indicated in this figure, the propagation loss increases rapidly in a certain voltage domain. The domain where the SAW is attenuated rapidly corresponds to a voltage domain where the surface of the semiconductor (interface piezoelectric substance/semiconductor body) is strongly inverted. FIG. 10 illustrates a comparison of a C-V characteristic (capacity-voltage characteristic) curve (curve b) with the propagation loss (curve a). As can be seen in the figure, the propagation loss increases rapidly, when the semiconductor surface is strongly inverted (domain at the left side of the broken line).

Therefore, by applying a great bias voltage producing a strongly inverted domain to a metal electrode, it is possible to cut off a SAW in this domain. Further, since it acts as a variable attenuator depending on the bias voltage, when the applied bias voltage is not so great, it is possible to obtain band characteristics having a large freedom and to vary continuously the propagation loss of SAW by regulating bias voltages applied to each of the metal electrodes.

DETAILED DESCRIPTION

Figure 1:
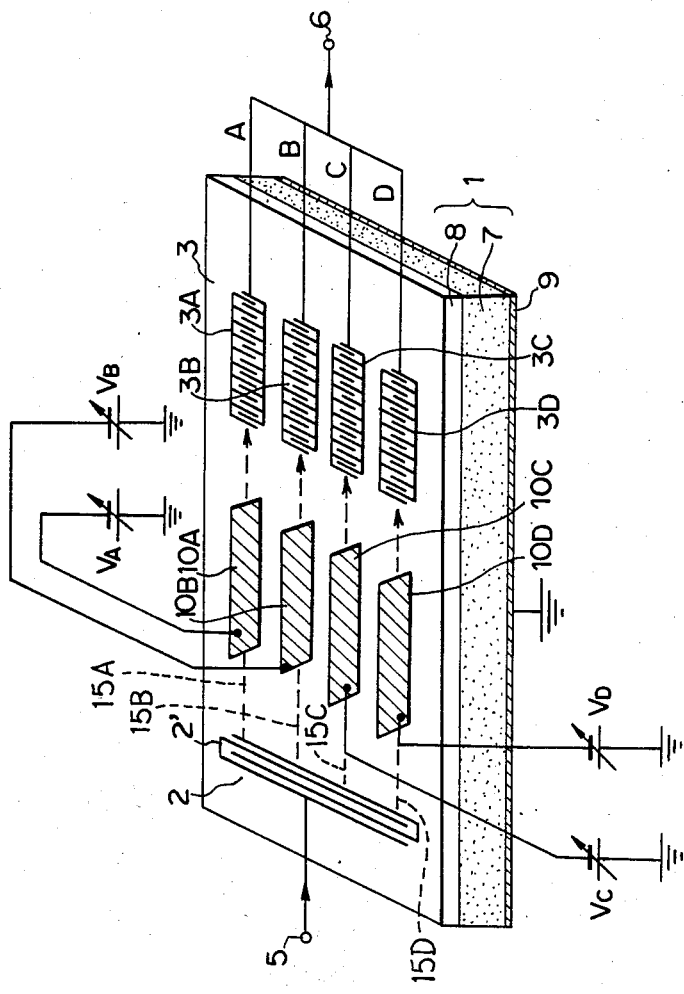
FIG. 1 is a perspective view of a variable band SAW filter according to an embodiment of this invention.

Hereinbelow, this invention will be described more in detail in the light of some embodiments, referring to the drawings, but they are not at all intended to be restrictive and it should be understood that various modifications and ameliorations are possible without departing from the scope of this invention.

Figure 8A:
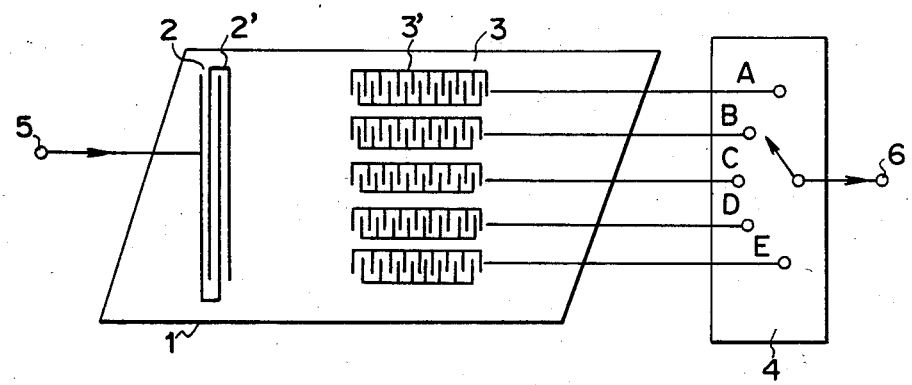
FIG. 8A is a top view of a variable band prior art SAW filter and FIG. 8B is a diagram illustrating the relation between the output and the frequency for the filter of FIG. 8A.
Figure 8B:
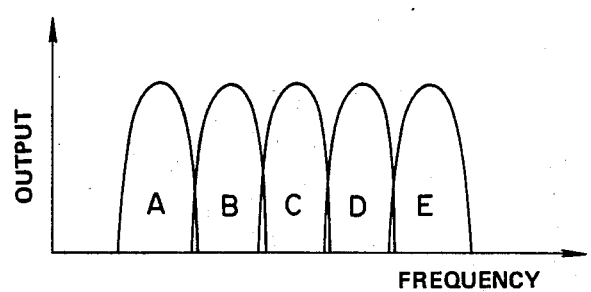
Figure 9:
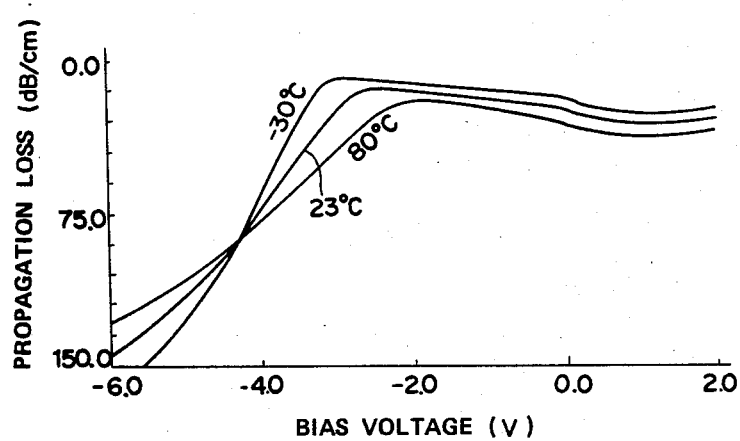
FIG. 9 shows graphs illustrating the relation between the propagation loss and the bias voltage with the parameter of temperature.
Figure 10:
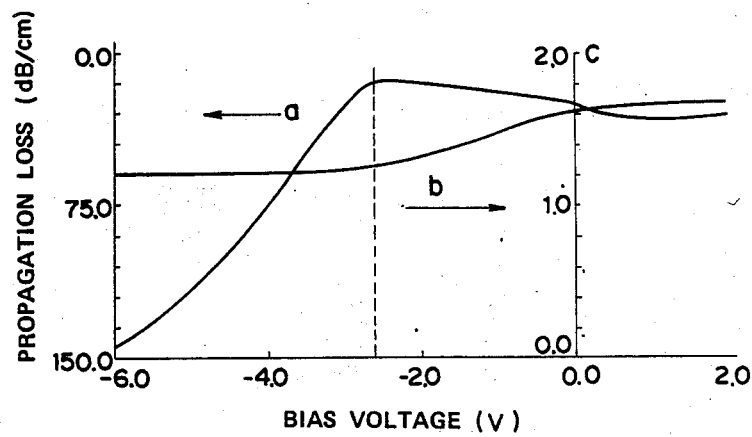
FIG. 10 shows graphs illustrating the relation between the bias voltage and the propagation loss as well as the high frequency capacitance.

FIG. 1 is a perspective view illustrating an embodiment of a variable band SAW filter according to this invention. In figure, the corresponding items are designated by the same reference numerals as used in FIG. 8. A semiconductor substrate 7 and a piezoelectric film 8 disposed thereon constitute a piezoelectric substrate 1. On the other surface, which is opposite to the piezoelectric film 8, of the semiconductor substrate 7 is disposed a back side electrode 9, which is grounded. At one end of the surface of the piezoelectric substrate 1 are disposed comb-shaped electrodes 2' constituting the input transducer 2, and at the other end are comb-shaped electrodes 3A, 3B, 3C, 3D constituting the output transducer 3, which are so formed that each of them responds only to a SAW within a respective one of four bands which differ from each other. All the output comb-shaped electrodes 3A, 3B, 3C, 3D are connected to the output terminal 6. Between the input comb-shaped electrodes 2' and the output comb-shaped electrodes 3A, 3B, 3C, 3D are disposed metal electrodes 10A, 10B, 10C, 10D. A surface acoustic wave travelling from the input transducer 2 to the output transducer 3 will have portions which travel along respective paths of travel 15A, 15B, 15C, 15D to the respective electrodes 3A, 3B, 3C, 3D, and each of the electrodes 10A, 10B, 10C, 10D is elongate and is positioned over a respective path of travel 15A, 15B, 15C, 15D so as to extend parallel thereto. For each of four the filters one of four bias voltages $V_A$, $V_B$, $V_C$, $V_D$ is applied between a respective one of the metal electrodes and the back side electrode 9. The band of the whole filter is varied by controlling each bias voltage. When the bias voltages $V_A$, $V_B$, $V_C$, $V_D$ applied to the metal electrodes 10A, 10B, 10C, 10D are varied, the propagation loss due to the effect of each of the filter varies, and therefore the whole pass band can be set differently by adjusting the bias voltages.

Figure 2:
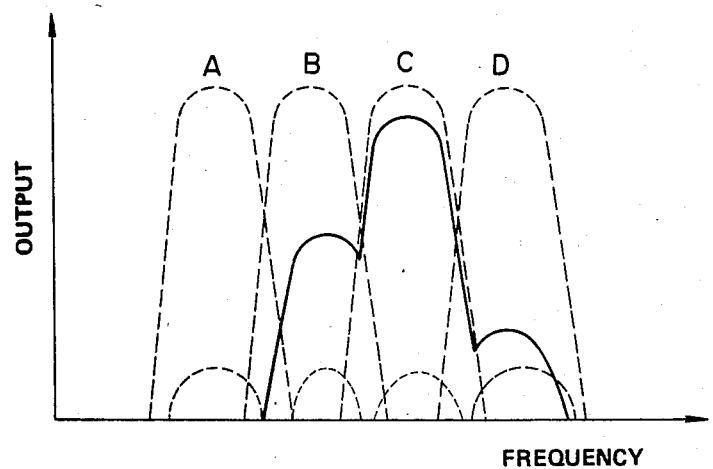
FIG. 2 is a diagram showing a relation between the output and frequency for the filter of FIG. 1.

FIG. 2 shows variations of the propagation loss, as a function of frequency, due to the insertion of the filters in the bands A, B, C, D for different bias voltages. The bias voltages can be selectively set so that a desired output can be obtained, e.g. as indicated by the solid line.

Figure 3:
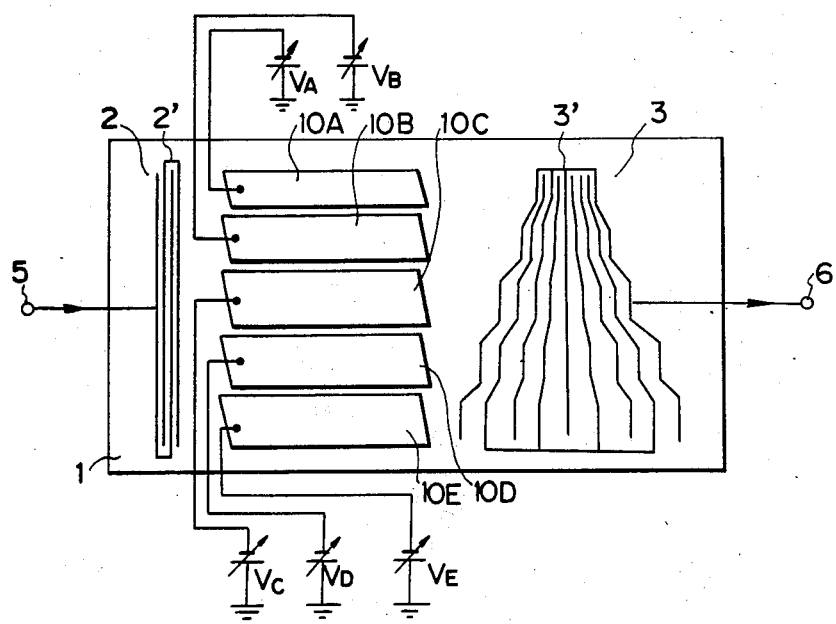
FIG. 3 is a top view of a SAW filter according to another embodiment of this invention.

In the device indicated in FIG. 1 the output transducer 3 is divided into a plurality of pairs of comb-shaped electrodes so that the whole output power is taken out as the sum of the outputs in parallel, but also a structure such as is indicated in FIG. 3 is possible.

On the back side surface of the device indicated in FIG. 3 is disposed a back side electrode, which is grounded, just as described in the preceding embodiment, and the bias voltages $V_A$, $V_B$, $V_C$, $V_D$ and $V_E$ are applied to the metal electrodes 10A, 10B, 10C, 10D and 10E, respectively, in the same way as they are for the preceding embodiment. The difference between the device indicated in FIG. 3 and that indicated in FIG. 1 consists only in that the output transducer 3 consists of only one pair of comb-shaped electrodes 3' and that the pitch or spacing of the comb-shaped electrodes 3' varies discontinuously in a direction perpendicular to the propagation direction of a SAW. Each of the pitches of the electrodes corresponds to one of the bands A, B, C, D, E and thus the device indicated in FIG. 3 works in the same way as that indicated in FIG. 1. The advantage of this form is that the bands can be divided more finely and that bonding steps for taking out the output to the exterior can be reduced.

Furthermore, if the metal electrodes 10 are formed to be finer and are disposed so as to be closely adjacent to each other and if the pitch of the comb-shaped electrodes 3' varies continuously in the direction perpendicular to the propagation direction of a SAW, it is possible to selectively adjust the pass band by selecting the distribution of the bias voltages. The semiconductor substrate in the devices indicated in FIGS. 1, 3 and 4 can include an insulating film such as an oxide film, nitride film, etc. obtained by oxidizing or nitriding its surface.

Further, the material of the metal electrodes can be the same as that of the comb-shaped electrodes, and during fabrication they are produced by the same process (a photolithographic process) and at the same time as the comb-shaped electrodes.

Figure 4:
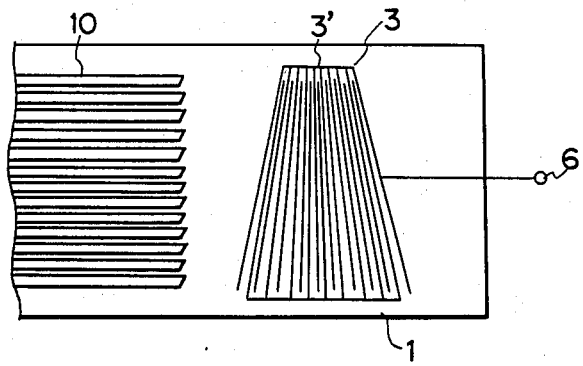
FIGS. 4, 5 and 6 are partial top views of SAW filters according to three other different embodiments of this invention.
Figure 5:
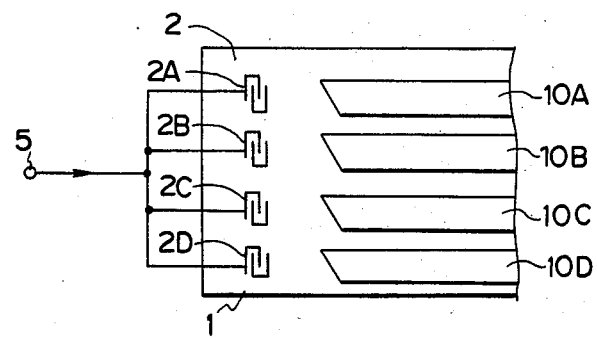
Figure 6:
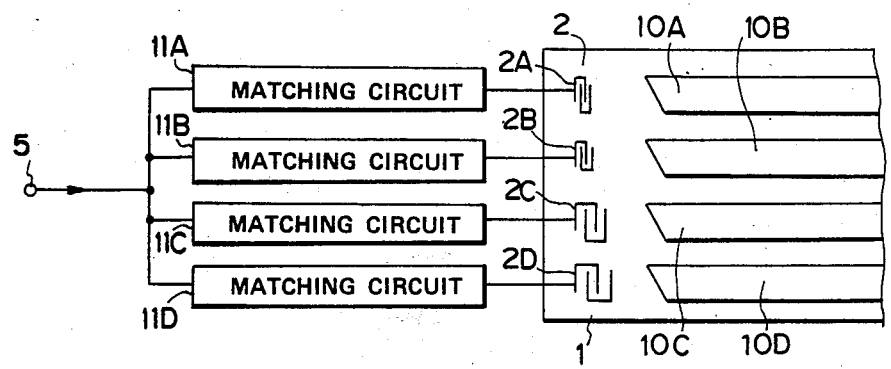
Figure 7:
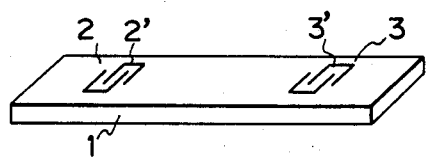
FIG. 7 is a perspective view of a fixed band prior art SAW filter.

Moreover, although the input transducer indicated in FIGS. 1, 3 and 4 consists of only one pair of comb-shaped electrodes, which are common to all the filters, it can consist of a plurality of pairs of comb-shaped electrodes 2A, 2B, 2C, 2D, as indicated in FIG. 5, having the same input characteristics.

Further, the input transducer can consists of a plurality of pairs of comb-shaped electrodes 2A, 2B, 2C, 2D having different input characteristics. However, in this case, each pair of comb-shaped electrodes must be matched by using separate matching circuits 11A, 11B, 11C, 11D.

In addition, it is desirable to form the end surface of each of the metal electrodes 10A, 10B, ... so that it is inclined with respect to the propagation direction of a SAW, because influences due to the reflection of a SAW at the end surface is reduced in this way.

Figure 11:
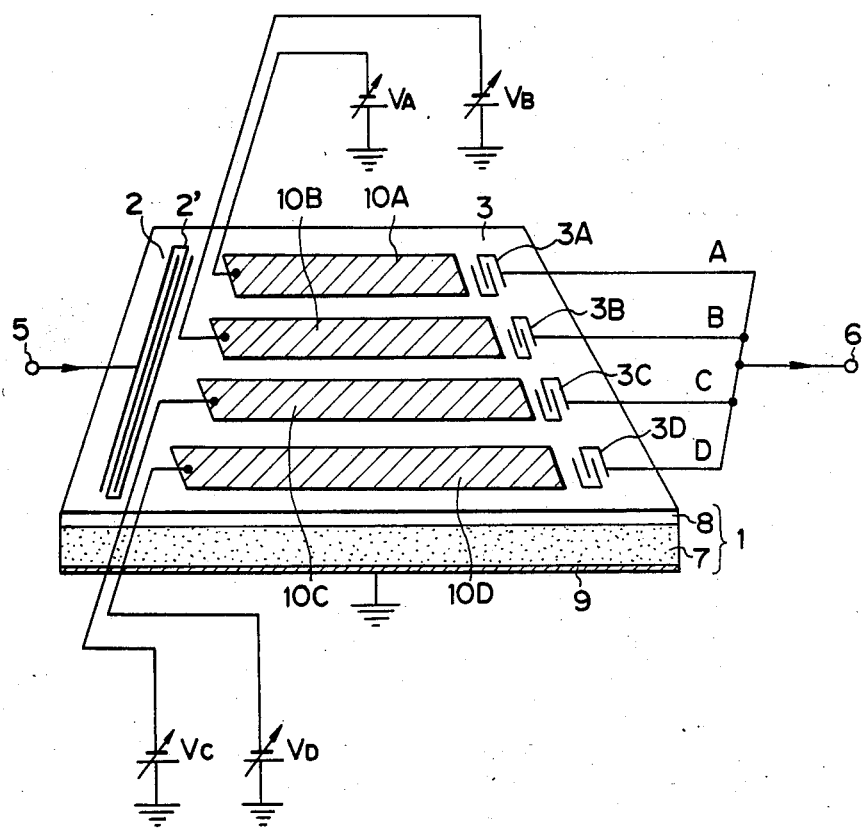
FIG. 11 is a perspective view illustrating a variable SAW delay line according to an additional embodiment of this invention.

FIG. 11 is a perspective view of variable SAW delay lines according to this invention.

A semiconductor 7 and a piezoelectric film 8 disposed thereon constitute a piezoelectric substrate 1. On the other surface, which is opposite to the piezoelectric film 8, of the semiconductor substrate 7 is disposed a back side electrode 9, which is grounded. At one end of the surface of the piezoelectric substrate 1 are disposed comb-shaped electrodes 2' constituting the input transducer 2 and at the other end are comb-shaped electrodes 3A, 3B, 3C, 3D constituting the output transducer 3. The distances between the output electrodes 3A, 3B, 3C, 3D and the respective input comb-shaped electrodes 2 are different from each other so that the times necessary for a SAW emitted by the transducer 2 to reach the output transducers 3A, 3B, 3C, 3D are different from each other. All the electrodes 3A, 3B, 3C, 3D are connected to the output terminal 6. Metal electrodes 10A, 10B, 10C and 10D are mounted on the propagation paths of surface acoustic waves traveling from the input transducer 2 to the electrodes 3A, 3B, 3C and 3D, respectively, and bias voltages $V_A$, $V_B$, $V_C$ and $V_D$ are applied to these metal electrodes, respectively. According to the working principle described above, when the bias voltages $V_A$, $V_B$, $V_C$, $V_D$ are so set that the surface of the semiconductor substrate is strongly inverted, surface acoustic waves propagating in the portions under the metal electrodes 10A, 10B, 10C, 10D are rapidly attenuated. To the contrary, by setting the bias voltages so that the surface of the semiconductor substrate is at the depletion state or weakly inverted or at a sufficiently charged state, it is also possible to make the attenuation of a SAW sufficiently small. Consequently, by controlling the bias voltages $V_A$, $V_B$, $V_C$, $V_D$ applied to the metal electrodes 10A, 10B, 10C, 10D, it is possible to selectively permit and prevent surface acoustic waves from reaching each of the output comb-shaped electrodes 3A, 3B, 3C, 3D. Further, since it is also possible to vary continuously the propagation loss of surface acoustic waves by regulating the bias voltages $V_A$, $V_B$, $V_C$, $V_D$, the output level of each of the delay lines can be suitably controlled.

In this case, since it is possible to control the propagation of surface acoustic waves only by commuting the bias voltages, the device according to this invention as an advantage that the circuit therefor can be simplified with respect to that of the prior art device, by which SAW selection is effected bt switching of RF signals. Further, since the semiconductor substrate is cheaper and large size substrates are available more easily with respect to the piezoelectric body, the substrate according to this invention has an advantage that it can be fabricated with a lower cost than the substrate used by the prior art techniques.

Figure 12:
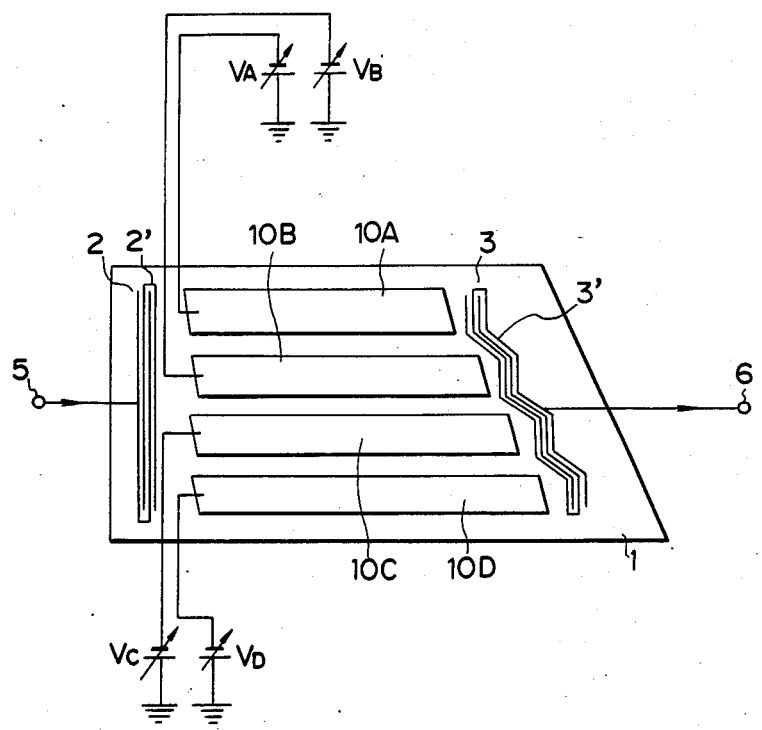
FIG. 12 is a top view illustrating a variable SAW delay line according to another embodiment of this invention.

Although in the device illustrated in FIG. 11, the output transducer 3 is divided into a plurality of pairs of comb-shaped electrodes 3A, 3B, 3C, 3D and the final output is taken out in the form of a resultant output of plural circuits connected in parallel, the structure as illustrated in FIG. 12 is also possible.

In the device illustrated in FIG. 12 the output transducer 3 consists of one pair of comb-shaped electrodes 3', which are constructed in the form of stairs so that the distance between the input transducer and the output comb-shaped electrodes in the propagation direction of a SAW varies discontinuously in the direction perpendicular to the propagation direction of a SAW. It is clear that the device illustrated in FIG. 12 works in completely the same manner as that illustrated in FIG. 11.

Figure 13:
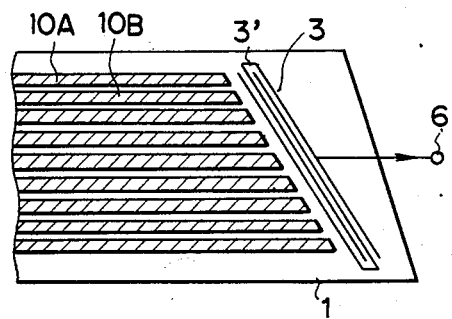
FIGS. 13 to 16 are partial top views of variable SAW delay lines according to four other different embodiments of this invention.

Furthermore, the output comb-shaped electrodes 3' can be formed as illustrated in FIG. 13.

In the devices illustrated in FIGS. 12 and 13 the comb-shaped electrodes 3' of the input transducer 3 are so disposed that the distances between the comb-shaped electrodes 2' of the input transducer 2 and the comb-shaped electrodes 3' of the output transducer 3 respectively vary discontinuously or continuously in the direction perpendicular to the propagation direction of SAW. In this way, it is possible to obtain as advantages that the delay time can be regulated more accurately and that bonding steps for taking out the output to the exterior can be reduced.

Figure 14:
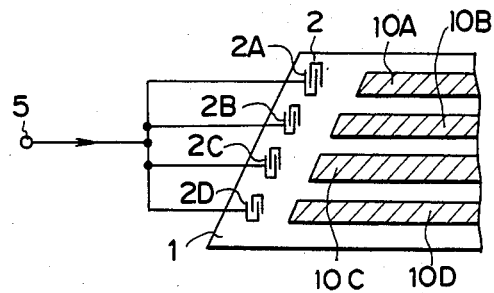
Figure 15:
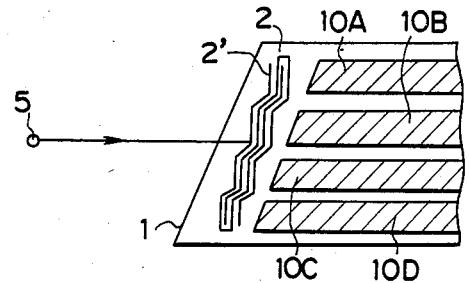
Figure 16:
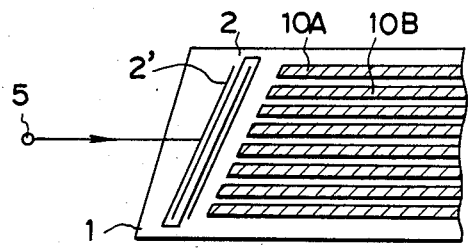

Similarly the input transducer 2 may be divided into a plurality of electrodes 2A, 2B, 2C, 2D, as indicated in FIG. 14, or only one pair of electrodes 2' may be constructed in the form of stairs, as indicated in FIG. 15, or they may be inclined with respect to the propagation path of a SAW, as indicated in FIG. 16.

Furthermore, it is desirable that the end surfaces of the metal electrodes 10A, 10B, . . . be inclined with respect to the propagation direction of a SAW, because in this way influences due to the reflection of a SAW at the end surfaces are reduced.

Figure 17:
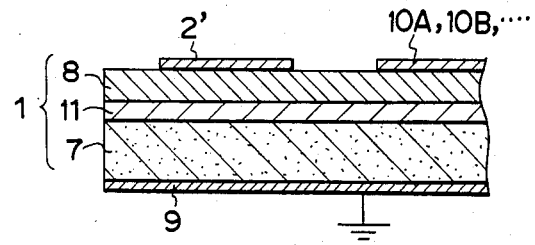
FIGS. 17 to 19 are cross-sectional views of variable SAW delay lines according to three other different embodiments of this invention.

The semiconductor substrate 7 used for this invention can be covered by an insulating film 11, such as an oxide film, a nitride film, etc. by oxidizing or nitriding its surface, as indicated in FIG. 17.

Figure 18:
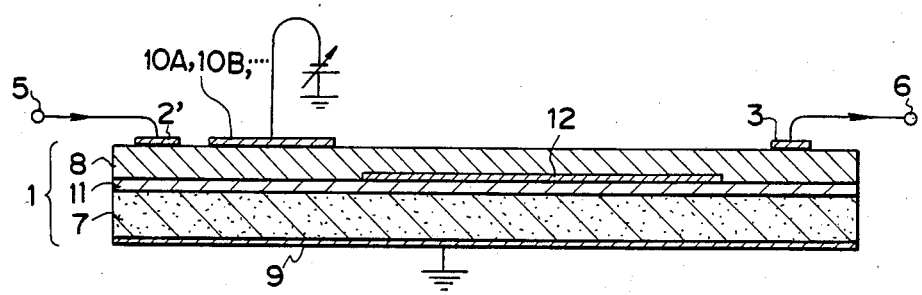

In addition, for the piezoelectric substrate 1, as illustrated in FIG. 18, the propagation path of a SAW can be divided into two regions, in one of which metal electrodes 10A, 10B, . . . are disposed for controlling the propagation of the SAW and in the other of which a metal film 12 is disposed at the interface between the piezoelectric film 8 and the semiconductor substrate 7 or the insulating film 11. For such a structure, in the portion where a metal film 12 exists, the potential of a SAW is shielded and thus the semiconductor substrate and SAW do not interfere with each other. This structure is advantageous, when a long delay time is required, because attenuation of a SAW is extremely small.

Figure 19:
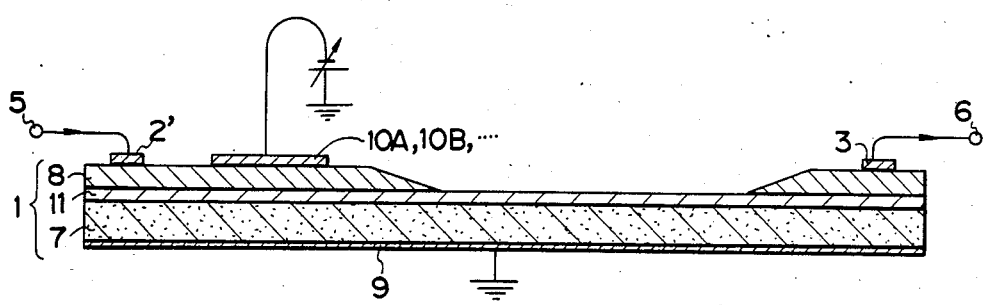
Figure 20:
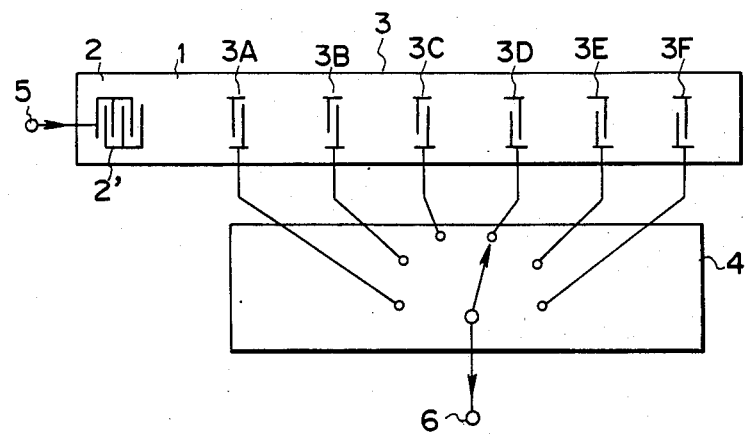
FIGS. 20 and 21 are top views illustrating two prior art variable SAW delay lines.
Figure 21:
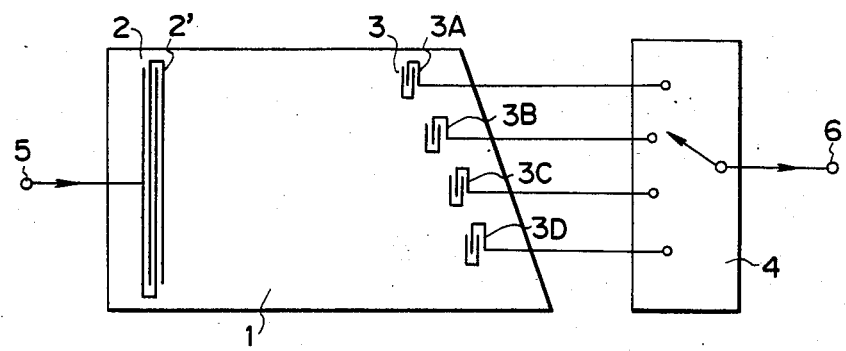

Furthermore, as indicated in FIG. 19, it is also possible to use another substrate structure, by which the piezoelectric film is disposed on the portion where the input comb-shaped electrodes 2'' and the metal electrodes 10A, 10B, . . . exist but is not on the propagation paths of surface acoustic waves therebetween. This structure is, similar to that indicated in FIG. 19, advantageous when a long delay time is required, because a SAW propagates through the crystal semiconductor substrate 7, where the piezoelectric film 8 does not exist, and thus the attenuation of the SAW is extremely small there.

As explained above, according to this invention, space saving and cost reduction can be achieved with respect to prior art variable band SAW filters, because it is not necessary to provide separate switching elements separately for each of the filters for selecting arbitrarily an output. In the device according to this invention, since a function equivalent to the switching can be realized only by switching on/off the bias voltages, the circuit itself is simplified. Further, since the propagation loss for each of the bands can be infintely varied by controlling the bias voltages in the analog manner, band characteristics of large freedom in selection can be obtained.

SAW filters according to this invention can be applied to all sorts of apparatus where SAW filters are used. However, they are useful specifically for communication apparatuses, in which the frequency band is varied in time, such as CATV, communication satellite, relay, tranceiver, and multi-channel communication apparatuses.

The embodiments of the invention in which an exclusive property or privilege is claimed are defined as follows:

1. A surface acoustic wave device, comprising:
   a semiconductor substrate;
   a piezoelectric film disposed on said semiconductor substrate;
   an input transducer and an output transducer disposed at two locations on said piezoelectric film;
   a plurality of metal electrodes disposed between said input transducer and said output transducer;
   bias voltage applying means for applying a respective bias voltage to each of said metal electrodes; and
   bias voltage regulating means for regulating said bias voltages;
   wherein an insulating film is provided between said semiconductor substrate and said piezoelectric film; and
   wherein a metal film is disposed between said metal electrodes and said output transducer on said insulating film.

2. A surface acoustic wave device, comprising:
   a semiconductor substrate;
   a piezoelectric film disposed on said semiconductor substrate;
   an input transducer and an output transducer disposed at two locations on said piezoelectric film;
   a plurality of metal electrodes disposed between said input transducer and said output transducer;
   bias voltage applying means for applying a respective bias voltage to each of said metal electrodes; and
   bias voltage regulating means for regulating said bias voltages;
   wherein an insulating film is provided between said semiconductor substrate and said piezoelectric film; and
   wherein said piezoelectric film is omitted in a region between said metal electrodes and said output transducer.

3. A surface acoustic wave device comprising:
   a semiconductor substrate;
   a piezoelectric film provided on said semiconductor substrate;
   an input transducer and an output transducer provided at spaced locations on said piezoelectric film, wherein a surface acoustic wave travelling through said piezoelectric film from said input transducer to said output transducer has respective portions which travel along respective paths of travel;
   a plurality of elongate metal electrodes provided on said piezoelectric film between said input transducer and said output transducer, each said metal electrode being positioned along a respective said surface acoustic wave path of travel so as to extend parallel thereto;
   bias voltage applying means for applying to each of said metal electrodes a respective bias voltage; and
   bias voltage regulating means for regulating said bias voltages so as to control the propagation losses of surface acoustic waves traveling past said metal electrodes along said paths of travel;
   wherein an end surface of each of said metal electrodes is inclined with respect to the direction of propagation of surface acoustic waves along the associated path of travel.

4. A surface acoustic wave device comprising:
   a semiconductor substrate;
   a piezoelectric film provided on said semiconductor substrate;
   an input transducer and an output transducer provided at spaced locations on said piezoelectric film, wherein a surface acoustic wave travelling through said piezoelectric film from said input transducer to said output transducer has respective portions which travel along respective paths of travel;
   a plurality of elongate metal electrodes provided on said piezoelectric film between said input transducer and said output transducer, each said metal electrode being positioned along a respective said surface acoustic wave path of travel so as to extend parallel thereto;
   bias voltage applying means for applying to each of said metal electrodes a respective bias voltage;
   bias voltage regulating means for regulating said bias voltages so as to control the propagation losses of surface acoustic waves traveling past said metal electrodes along said paths of travel;
   an insulating film provided between said semiconductor substrate and said piezoelectric film; and
   a metal film disposed on said insulating film between said metal electrodes and said output transducer.

5. A surface acoustic wave device comprising:
   a semiconductor substrate;
   a piezoelectric film provided on said semiconductor substrate;
   an input transducer and an output transducer provided at spaced locations on said piezoelectric film, wherein a surface acoustic wave travelling through said piezoelectric film from said input transducer to said output transducer has respective portions which travel along respective paths of travel;
   a plurality of elongate metal electrodes provided on said piezoelectric film between said input transducer and said output transducer, each said metal electrode being positioned along a respective said surface acoustic wave path of travel so as to extend parallel thereto;
   bias voltage applying means for applying to each of said metal electrodes a respective bias voltage;
   bias voltage regulating means for regulating said bias voltages so as to control the propagation losses of surface acoustic waves traveling past said metal electrodes along said paths of travel; and
   an insulating film provided between said semiconductor substrate and said piezoelectric film;
   wherein said semiconductor substrate is free of said piezoelectric film in a region between said metal electrodes and said output transducer.

* * * * *